(12) United States Patent
Zhang et al.

(10) Patent No.: US 12,174,232 B2
(45) Date of Patent: Dec. 24, 2024

(54) APPARATUS, METHOD, SYSTEM AND MEDIUM FOR MEASURING PULSE SIGNAL WIDTH

(71) Applicant: Lemon Inc., Grand Cayman (KY)

(72) Inventors: Junmou Zhang, Los Angeles, CA (US); Dongrong Zhang, Beijing (CN); Shan Lu, Los Angeles, CA (US); Jian Wang, Beijing (CN)

(73) Assignee: Lemon Inc., Grand Cayman (KY)

( * ) Notice: Subject to any disclaimer, the term of this patent is extended or adjusted under 35 U.S.C. 154(b) by 168 days.

(21) Appl. No.: 17/833,884

(22) Filed: Jun. 6, 2022

(65) Prior Publication Data

US 2023/0003781 A1 Jan. 5, 2023

(30) Foreign Application Priority Data

Jun. 30, 2021 (CN) .......................... 202110736084.5

(51) Int. Cl.
*G01R 29/02* (2006.01)
*H03K 5/19* (2006.01)
*H03K 19/21* (2006.01)

(52) U.S. Cl.
CPC ............. *G01R 29/023* (2013.01); *H03K 5/19* (2013.01); *H03K 19/21* (2013.01)

(58) Field of Classification Search
CPC ........ H03K 5/19; H03K 19/21; G01R 35/005; G01R 29/023

(Continued)

(56) References Cited

U.S. PATENT DOCUMENTS 3,304,504 A  2/1967 Horlander
5,812,626 A  9/1998 Kusumoto et al.
(Continued)

FOREIGN PATENT DOCUMENTS

CN  104460304 A  3/2015
CN  208422419 U  1/2019
(Continued)

OTHER PUBLICATIONS

Bang et al.; "25.1 A Fully Synthesizable Distributed and Scalable All-Digital LDO in 10nm CMOS"; IEEE Int'l Solid State Circuits Conf.; 2020; 3 pages.

(Continued)

*Primary Examiner* — Giovanni Astacio-Oquendo
(74) *Attorney, Agent, or Firm* — BakerHostetler

(57) ABSTRACT

A apparatus, method, system and medium are provided. The apparatus includes: a buffer chain, including N first buffers connected end to end, N first AND gates with one input connected to a pulse signal and the other input connected to an output of a corresponding first buffer, and N flip-flops coupled with outputs of respective first AND gates; a path time delay adjustment circuit, with an input receiving a pulse signal, and an output connected to an input terminal of the first buffer; a control apparatus, controlling the time delay produced by the adjustment circuit to be reduced by at least one step from a preset time delay during each adjustment until an output of a $P^{th}$ flip-flop flips; a measuring device measuring the pulse signal's width according to an output of each flip-flop, the time delay of each first buffer and the time delay of the adjustment circuit.

20 Claims, 7 Drawing Sheets

(58) Field of Classification Search
USPC .................................... 324/96, 76.11, 71.1
See application file for complete search history.

(56) References Cited

U.S. PATENT DOCUMENTS

| | | | |
|---|---|---|---|
| 6,642,801 B1 | 11/2003 | Zortea et al. | |
| 8,531,196 B1 | 9/2013 | Shelat et al. | |
| 8,558,579 B2* | 10/2013 | Zhang | H03K 5/1252 327/31 |
| 10,778,164 B2* | 9/2020 | Liang | H03K 3/027 |
| 2009/0112499 A1 | 4/2009 | Chao et al. | |
| 2014/0021993 A1* | 1/2014 | Poddutur | H03K 3/013 716/114 |
| 2014/0184243 A1 | 7/2014 | Iyer et al. | |
| 2018/0269855 A1* | 9/2018 | Martinez | G06F 7/58 |
| 2019/0089341 A1 | 3/2019 | Nagayama | |
| 2019/0346504 A1 | 11/2019 | Choo et al. | |
| 2022/0068416 A1* | 3/2022 | Zhang | G11C 29/12015 |
| 2023/0291395 A1* | 9/2023 | Jouanneau | H03K 5/15093 |

FOREIGN PATENT DOCUMENTS

| | | |
|---|---|---|
| CN | 109581184 A | 4/2019 |
| CN | 110827875 A | 2/2020 |
| CN | 111693785 A | 9/2020 |
| CN | 112751554 A | 5/2021 |
| JP | 2014-140107 A | 7/2014 |

OTHER PUBLICATIONS

Yu et al.; "NBTI and HCI Aging Prediction and Reliability Screening During Production Test"; IEEE Transactions on Computer-Aided Design of Integrated Circuits and Systems; vol. 39; 2020; 14 pages.

International Patent Application No. PCT/SG2022/050348; Int'l Search Report; dated Jan. 4, 2023; 3 pages.

European Patent Application No. 22833767.1; Office Action; dated Oct. 29, 2024; one page.

European Patent Application No. 22833767.1; Extended Search Report; dated Oct. 10, 2024; 14 pages.

* cited by examiner

APPARATUS, METHOD, SYSTEM AND MEDIUM FOR MEASURING PULSE SIGNAL WIDTH

CROSS REFERENCES TO RELATED APPLICATIONS

The present application claims priority to Chinese Patent Application No. 202110736084.5, titled "APPARATUS, METHOD, SYSTEM AND MEDIUM FOR MEASURING PULSE SIGNAL WIDTH", filed on Jun. 30, 2021 with the Chinese Patent Office, which is incorporated herein by reference in its entirety.

TECHNICAL FIELD

The application relates to the field of integrated circuits, and more particularly, relates to a pulse signal width measuring apparatus, method, system and medium for measuring a time delay of a critical path.

BACKGROUND

Modern integrated circuits may be affected by process deviation during the manufacturing process, which leads to different performances among different finished products. For example, some integrated circuits can operate at a frequency of 3 GHz, while others can only operate at a frequency of 2.8 GHz. A running speed of an integrated circuit is usually determined by a critical path time delay inside a chip. Generally, the critical path is a batch of paths with a longest time delay inside the integrated circuit.

SUMMARY

According to one aspect of the present application, it is provided a pulse signal width measuring apparatus, which comprises: a buffer chain, comprising N first buffers, N first AND gates with one input terminal connected to a pulse signal and the other input terminal connected to an output of a corresponding first buffer, and N flip-flops correspondingly coupled to output terminals of respective first AND gates, wherein an output terminal of each of the N first buffers is connected to an input terminal of a next first buffer, wherein N is a positive integer greater than 1; a path time delay adjustment circuit, wherein an input terminal of the path time delay adjustment circuit receives a pulse signal, and an output terminal of the path time delay adjustment circuit is connected to an input terminal of the first buffer in the buffer chain; a control device, which controls a time delay produced by the path time delay adjustment circuit to be reduced by at least one preset adjustment step length from a preset time delay according to a preset adjustment step length during each adjustment until an output of a $P^{th}$ flip-flop changes, wherein P is a positive integer less than or equal to N; a measuring device connected to output terminals of the respective flip-flops and the control device, wherein the measuring device measures the width of the pulse signal at least according to a result output by the output terminals of the respective flip-flops, the time delay of each first buffer, and the time delay of the path time delay adjustment circuit immediately before the output of the $P^{th}$ flip-flop changes.

According to another aspect of the present application, it is provided a pulse signal width measuring method of a pulse signal width measuring apparatus, wherein the pulse signal width measuring apparatus comprises: a buffer chain, comprising N first buffers, N first AND gates with one input terminal connected to a pulse signal and the other input terminal connected to an output of a corresponding first buffer, and N flip-flops correspondingly coupled to output terminals of respective first AND gate, wherein an output terminal of each of the N first buffers is connected to an input terminal of a next first buffer, wherein N is a positive integer greater than 1; a path time delay adjustment circuit, wherein an input terminal of the path time delay adjustment circuit receives a pulse signal, and an output terminal of the path time delay adjustment circuit is connected to an input terminal of the first buffer in the buffer chain; wherein the pulse signal width measuring method comprises the following steps: controlling a time delay produced by the path time delay adjustment circuit to be reduced by at least one preset adjustment step length from a preset time delay according to a preset adjustment step length during each adjustment until an output of a $P^{th}$ flip-flop changes, wherein P is a positive integer less than or equal to N; and measuring the width of the pulse signal at least according to a result output by output terminals of the respective flip-flops, the time delay of each first buffer, and the time delay of the path time delay adjustment circuit immediately before the output of the $P^{th}$ flip-flop changes.

According to another aspect of the present application, it is provided a computer system, which comprises: a processor; a memory, coupled to the processor and storing therein computer executable instructions for implementing the pulse signal width measuring method when executed by the processor.

According to another aspect of the present application, it is provided a computer readable medium, on which a computer program is stored, wherein the program, when executed by a processor, implements a pulse signal width measuring method.

BRIEF DESCRIPTION OF THE DRAWINGS

In order to more clearly explain the embodiments of the present disclosure or the technical schemes in the prior art, the following will briefly introduce accompanying drawings needed in the description of the embodiments or the prior art. Obviously, the drawings in the following description are only some embodiments of the present disclosure. For those of ordinary skill in the art, other drawings may be obtained according to these drawings without any creative effort.

DETAILED DESCRIPTION

Figure 1:
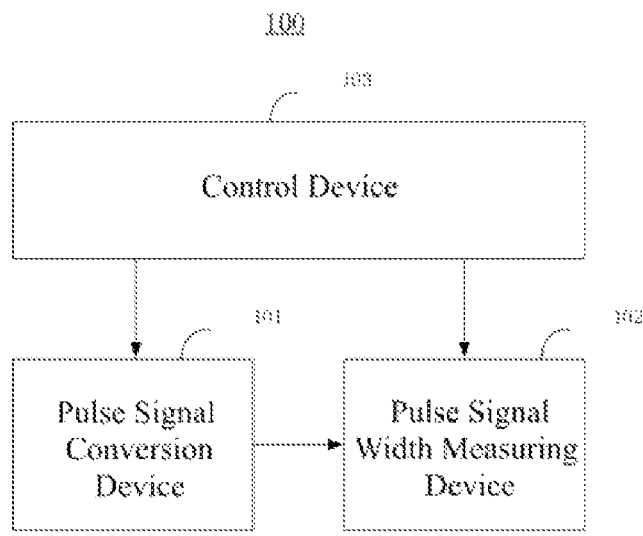
FIG. 1 shows an overall block diagram of a time-to-digital conversion circuit according to an embodiment of the present application.

Reference will now be made in detail to specific embodiments of the present application, examples of which are illustrated in the accompanying drawings. Although the application will be described in conjunction with specific embodiments, it will be understood that it is not intended to limit the application to the described embodiments. On the contrary, it is intended to cover changes, modifications and equivalents within the spirit and scope of this application and defined by the appended claims. It should be noted that the methods and steps described herein may be implemented by any functional block or functional arrangement, and any functional block or functional arrangement may be implemented as a physical entity or a logical entity, or a combination of both.

When the integrated circuit is operating, due to the influence of aging, temperature and power supply voltage, the time delay of internal paths of the integrated circuit may fluctuate, which may cause the time delay of some critical paths in the integrated circuit to exceed a clock cycle, resulting in errors in the operation of the integrated circuit.

Therefore, it is necessary to accurately measure the time delay of some critical paths in integrated circuits.

In traditional technologies, a time-to-digital conversion circuit may be used to measure a critical path time delay to judge a state of an integrated circuit, such as whether it is in a state of excessive aging, insufficient power supply voltage, etc.

The time-to-digital conversion circuit is also widely used to measure a time interval between two signals in the fields of ultrasonic flowmeter, high-energy physics and nuclear physics, various handheld/airborne or fixed working high-accuracy laser rangefinders, a laser radar, a laser scanner, etc.

Usually, the critical path time delay to be measured by the time-to-digital conversion circuit or the time interval between the two signals is several ns or even hundreds ps. During the measurement, the critical path time delay or the time interval between the two signals is firstly converted as one pulse signal, and width of the pulse signal is the critical path time delay or the time interval between the two signals.

The time-to-digital conversion circuit generally uses a number of to-be-measured signals passing through a logic gate circuit to carry out the measurement, whose accuracy depends on the time delay of a single logic gate circuit.

However, in the prior art, the designed structure is complex, and the accuracy depends on the time delay of the buffer, which leads to the problem of insufficient accuracy. At the same time, the time delay of the buffer may change due to the influence of aging, resulting in inaccurate measurement. It takes a long time to measure the path time delay, so normal working of the critical path is affected. Part of the design adopts an analog circuit, which is complicated to design and difficult to realize in the advanced manufacturing process.

According to the scheme of the application, the measurement accuracy of the pulse width is further improved through an adjustment scheme of the path time delay, and the accuracy can reach 25% of the time delay of a single buffer; further, by converting the measurement structure into a ring oscillator, the influence of errors caused by aging, wiring and other factors on the measurement accuracy of the application are reduced; the application can complete the measurement of the critical path time delay in only 4 clock cycles at the fastest, causing little influence on the critical path; and moreover, the application may be implemented with a pure digital circuit, which is convenient and easy to integrate.

FIG. 1 shows an overall block diagram of a time-to-digital conversion circuit 100 according to an embodiment of the present application.

As shown in FIG. 1, the time-to-digital conversion circuit 100 designed in this application mainly comprises three parts: a pulse signal conversion apparatus 101, a pulse signal width measuring apparatus 102 and a control device 103. The pulse conversion apparatus 101 mainly converts a to-be-measured object (for example, a critical path time delay or a to-be-measured time interval between two signals) into one pulse signal, and width of the pulse signal is a value of the to-be-measured object (i.e., the time interval). The pulse signal width measuring apparatus is used to measure the width of the pulse signal output by the pulse signal conversion apparatus 101. The control device is used to control operation of the pulse signal conversion apparatus 101 and the pulse signal width measurement apparatus.

Figure 2A:
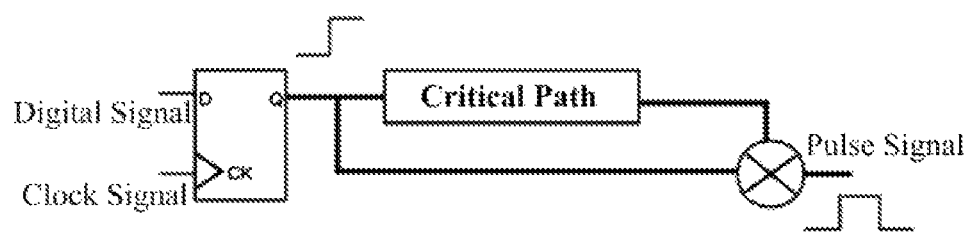
FIG. 2A shows a diagram of a circuit and a waveform for converting a critical path time delay into a pulse signal.

FIG. 2A shows a diagram of a circuit and a waveform for converting the critical path time delay into the pulse signal.

A same signal passing through two paths (one path has the critical path time delay, the other path has no time delay) is used and then input into a XOR gate to obtain the pulse signal with the critical path time delay as the width of its high level.

Specifically, generally, a starting point of the path is, for example, an output signal of one flip-flop, and the output of the flip-flop obtained after passing through the critical path and the output of the flip-flop after directly passing through a wire (i.e., which is still the input signal to the critical path) are input into one XOR gate with two ports at the same time. Since the critical path has a time delay, there is a time delay difference between the two signals arriving at the XOR gate. According to the characteristics of the XOR gate, when the two input signals are different (for example, the output obtained after the high-level output of the flip-flop passes through the critical path is still at low-level (because the high-level output has not passed the critical path at this time), and the direct output obtained by the output of the flip-flop directly passing through the wire is at high-level), the output of the XOR gate is at high-level; otherwise, when both input signals are high-level (i.e., the output obtained by the high level output of the flip-flop passing through the critical path is at high-level, and the direct output of the flip-flop is still at high-level, or low-level (for example, no signal is input), the output of the XOR gate is at low-level.

Figure 2B:
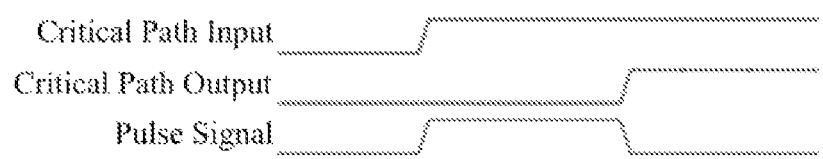
FIG. 2B shows a diagram of the waveform for converting the critical path time delay into the pulse signal.

Specifically, FIG. 2B shows a diagram of the waveform for converting the critical path time delay into the pulse signal. By configuring the flip-flop at the starting point of the critical path, the input of the critical path is one rising edge signal, and the output of the critical path is one rising edge signal which is delayed by the critical path time delay. After the two signals pass through the XOR gate, one pulse signal with the width of the high level as the critical path time delay can be output. That is, the pulse signal is the output of the XOR gate obtain by taking the signal obtained by the signal at the starting point of the critical path of the integrated circuit passing through the critical path and the signal at the starting point as two inputs of the XOR gate.

Here, using the XOR gate to obtain the above-mentioned specific output is only an example, and other circuits that can obtain the above-mentioned specific output after receiving the above-mentioned two inputs are also included in this disclosure, and will not be repeated here.

In addition to the above-mentioned method of measuring the critical path time delay to obtain the pulse signal with the width of of its high level as the critical path time delay, the above-mentioned method can also be used for the measurement of the time delay difference between the rising edges of two to-be-measured signals, by measuring the width of the converted pulse signal.

Figure 3A:
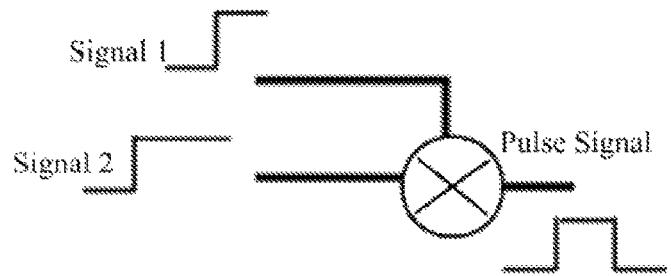
FIG. 3A shows a diagram of a circuit and a waveform for converting a time delay difference of two rising signals into a pulse signal.
Figure 3B:
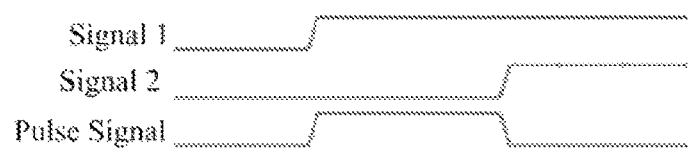
FIG. 3B shows a diagram of the waveform for converting the time delay difference of two rising signals into a pulse signal.

FIG. 3A shows a diagram of a circuit and a waveform for converting the time delay difference of the two rising signals into a pulse signal. The time delay difference between the rising edges of the two to-be-measured signals is the width of the converted pulse signal. FIG. 3B shows a diagram of the waveform for converting the time delay difference of the two rising signals into a pulse signal. After the two signals pass through the XOR gate, one pulse signal with the width of the time delay difference of the rising edges of the to-be-measured signals can be output.

Of course, in all the above examples, the rising edge is used as the starting point of the time delay difference, but in the actual circuit, a falling edge may also be used as the starting point of the time delay difference, and one pulse signal with the width of the time delay difference of the falling edges of the to-be-measured signals is output. Meanwhile, correspondingly, the XOR gate should be changed into other gates to realize the above conversion.

Figure 4:
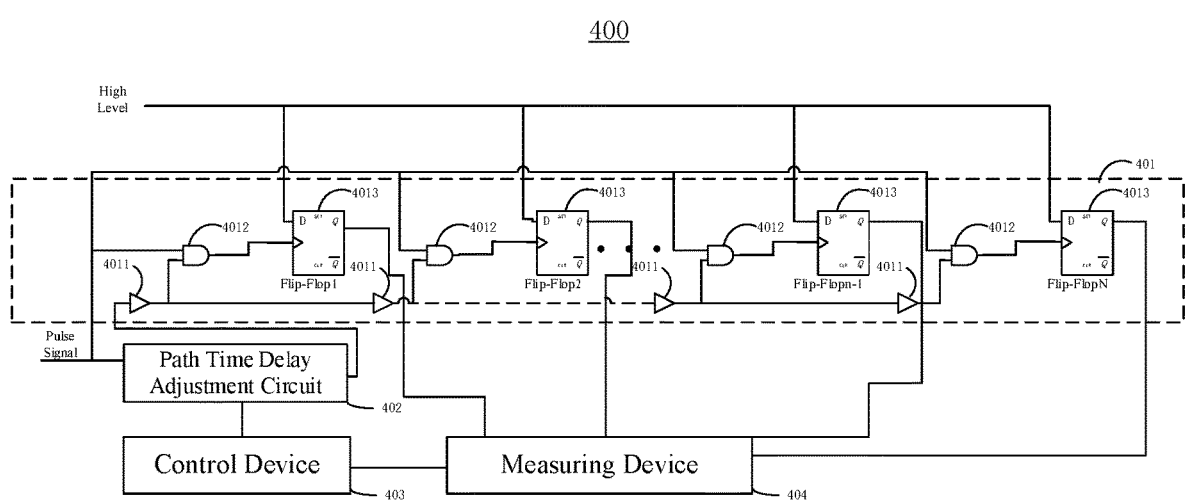
FIG. 4 shows a block diagram of an embodiment of a pulse signal width measuring apparatus according to an embodiment of the present application.

FIG. 4 shows a block diagram of an embodiment of a pulse signal width measuring apparatus according to an embodiment of the present application.

The pulse signal width measuring apparatus 400 comprises: a buffer chain 401, comprising N first buffers 4011, N first AND gates 4012 with one input terminal connected to a pulse signal and the other input terminal connected to an output of a corresponding first buffer 4011, and N flip-flops 4013 (flip-flop 1 to flip-flop N) correspondingly coupled to output terminals of respective first AND gates 4012, and an output terminal of each of the N first buffers 4011 are connected to an input terminal of a next first buffer 4011, wherein N is a positive integer greater than 1; a path time delay adjustment circuit 402, wherein an input terminal of the path time delay adjustment circuit 402 receives the pulse signal, and an output terminal of the path time delay adjustment circuit is connected to an input terminal of the first buffer 4011 in the buffer chain 401; a control device 403, which controls a time delay produced by the path time delay adjustment circuit 402 to be reduced by at least one preset adjustment step length from a preset time delay according to a preset adjustment step length during each adjustment until an output of a $P^{th}$ flip-flop 4013 changes, wherein P is a positive integer less than or equal to N; and a measuring device 404 connected to output terminals of the respective flip-flops 4013 and the control device 403, wherein the measuring device measures high-accuracy width of the pulse signal according to a result output by the output terminals of the respective flip-flops 4013, the time delay of each first buffer, and the time delay of the path time delay adjustment circuit 402 immediately before the output of the $P^{th}$ flip-flop 4013 changes.

In this way, the scheme that adds the path time delay adjustment circuit 402 improves the measurement accuracy to the preset adjustment step length of the path time delay adjustment circuit 402.

Figure 5:
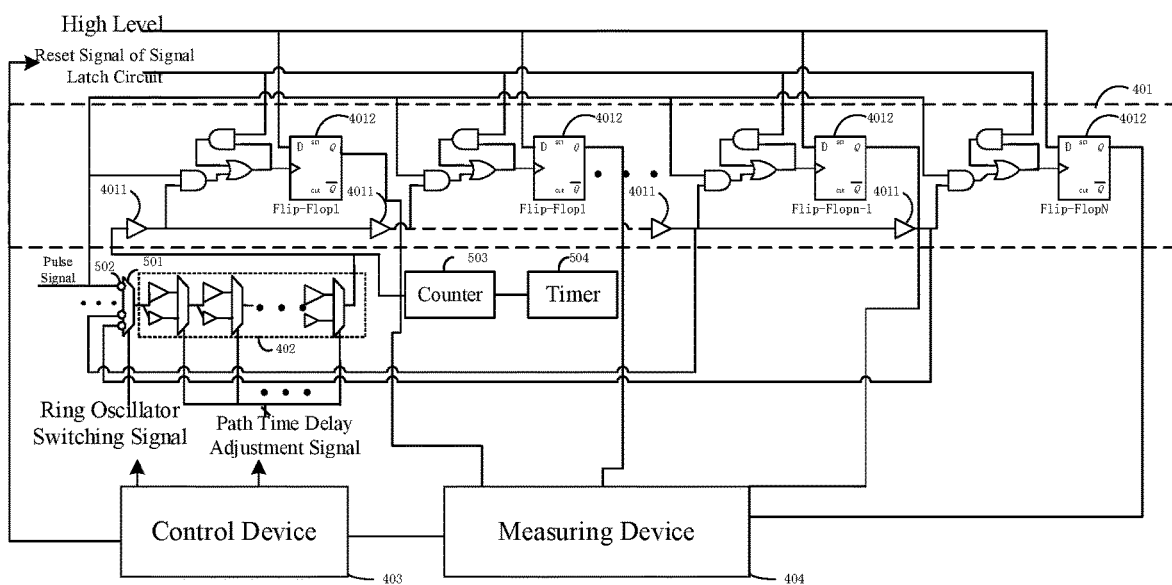
FIG. 5 shows a block diagram of another embodiment of the pulse signal width measuring apparatus according to an embodiment of the present application.

FIG. 5 shows a block diagram of another embodiment of a pulse signal width measuring apparatus 500 according to an embodiment of the present application. In FIG. 5, the same parts as those in FIG. 4 are identified by the same reference numerals. FIG. 5 will also be described in detail later.

Next, the structure and operation of each apparatus in FIG. 4 will be explained with reference to other drawings.

Figure 6:
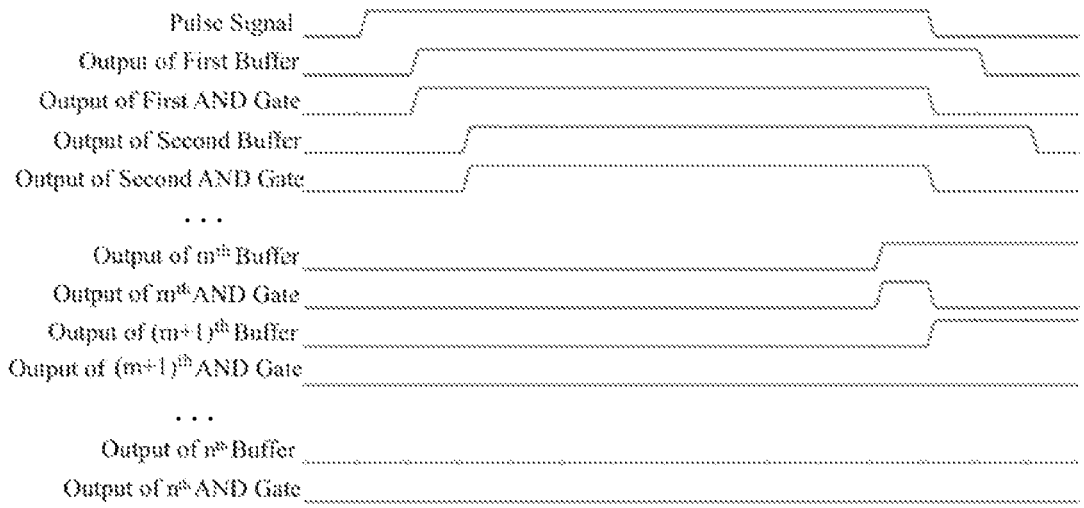
FIG. 6 shows an output waveform diagram of each first buffer and a first AND gate in a buffer chain when an exemplary pulse signal waveform is input without considering a path time delay adjustment circuit according to an embodiment of the present application.

FIG. 6 shows an output waveform diagram of each first buffer 4011 and each first AND gate 4012 in the buffer chain 401 when an exemplary pulse signal waveform is input without considering the path time delay adjustment circuit 402 according to an embodiment of the present application.

As shown in FIG. 6, when the to-be-measured pulse signal with a to-be-measured width is input, after the time delay of a first first buffer 4011, an output of the first first buffer 4011 has a waveform with the same width as shown in FIG. 6, and then after the time delay of a second first buffer 4011, an output of the second first buffer 4011 is shown in FIG. 6, and so on. It can be seen that each first buffer 4011 outputs the same waveform as the to-be-measured pulse signal, except that the output of each first buffer 4011 further delays the to-be-measured pulse signal by the time delay of the first buffer 4011.

After the first AND gate 4012 is added so that the to-be-measured pulse signal is AND-operated with the output of the first buffer 4011, when the to-be-measured pulse signal is at high-level, an output of the first AND gate 4012 is the same as the output signal of the first buffer 4011 connected to the first AND gate 4012, i.e., when the to-be-measured pulse signal is at high-level and the output signal of the first buffer 4011 input to the first AND gate 4012 is also at high-level, the output of the first AND gate 4012 is at high-level; otherwise, the output of the first AND gate 4012 is always at low-level. Then, according to the waveform of the pulse signal in FIG. 6, the output signal of the first first AND gate 4012 is shown in FIG. 6, and the output signal of the second first AND gate 4012 is shown in FIG. 6, and so on, until the output of an $m^{th}$ first AND gate 4012 is at high-level, but the output of an $(m+1)^{th}$ first AND gate 4012 is not at high-level, where m is a positive integer.

Under the control of the first AND gate 4012 for signal propagation control, the rising edge of the to-be-measured pulse signal can only pass through m first buffers 4011 within the time corresponding to the pulse signal width, wherein m<=N, so that the first AND gate 4012 for signal propagation control connected to the m first buffers 4011 can output one pulse signal, as shown in FIG. 6. By recording a number of first AND gates 4012 that output an high-level pulse signal, the width of pulse signal measured by the same number of first buffers 4011 can be recorded, i.e., by multiplying the number by the time delay of each first buffer 4011.

Of course, the measurement result is rough, because as long as the width of the pulse signal is longer than a total time delay of the $1^{st}$ first buffer 4011 to the $(m-1)^{th}$ first buffer 4011 by less than the time delay of one first buffer 4011, then the rising edge of the to-be-measured pulse signal will pass through the $m^{th}$ first buffers 4011 within the time corresponding to the width of the pulse signal, and it is inaccurate how much the width of the pulse signal is longer than the total time delay of the $1^{st}$ first buffer 4011 to the $(m-1)^{th}$ first buffer 4011. According to the embodiment of the present application, the width of the pulse signal may be further accurately measured by the path time delay adjustment circuit 402 later.

The following describes a specific high-accuracy measurement operation and functions of the path time delay adjustment circuit 402 according to an embodiment of the present application.

In the conventional technology, there is no path time delay adjustment circuit 402, but there are only the first buffer 4011 and the first AND gate 4012, so in the measurement which purely uses the buffer chain 401, a resolution of the pulse signal measured is equal to the time delay of a single buffer on the buffer chain 401. That is, it is known that the time delay of the first buffer 4011 is about 5 ps; if, as shown in FIG. 6, the output of the $m^{th}$ first AND gate 4012 is at high-level, but the output of the $(m+1)^{th}$ first AND gate 4012 is not at high-level, then the roughly-measured width of the pulse signal is m×5 ps. Actually, however, the width of the pulse signal may be between (m−1)×5 ps and m×5 ps, because as long as the width of the pulse signal is longer than the time delay of the $1^{st}$ first buffer 4011 to the $(m-1)^{th}$ first buffer 4011 and less than the time delay of the the $1^{st}$ first buffer 4011 to the $(m+1)^{th}$ first buffer 4011, the output of the first AND gate 4012 of the $m^{th}$ first buffer 4011 will be at a high-level. Therefore, the resolution of the measurement using the buffer chain 401 alone is insufficient. In an actual test, if the width of the to-be-measured pulse signal is 300 ps, then the measurement error corresponding to the buffer with the time delay of 5 ps is 1.67%, which will lead to the problem of insufficient resolution.

Therefore, this application further introduces one path time delay adjustment circuit 402, so the waveforms output by each first buffer 4011 and each first AND gate 4012 are different from those of FIG. 6, but it is also possible to refer to FIG. 6, i.e., the waveform output by the first first buffer 4011 should further delay the delay of the path time delay adjustment circuit 402 on the basis of FIG. 6 (note that the delay of the path time delay adjustment circuit 402 is not shown in FIG. 6), and the outputs of the subsequent first buffers 4011 should all be further delayed. Then, this path time delay adjustment circuit 402 is controlled by the control device 403, and the overall time delay of the path time delay adjustment circuit 402 can be gradually reduced in a very short step length.

It is assumed that the time delay of the first buffer 4011 in the buffer chain 401 is 5 ps, the preset time delay of the path time delay adjustment circuit 402 is initially 10 ps, the preset adjustment step length is 1 ps, and that the actual width of the to-be-measured pulse signal is 58 ps. Here, the preset adjustment step length is usually shorter than the time delay of one first buffer 4011, so as to make the time delay of the first buffer 4011 more accurate. In the prior measurement, if the result shows that the outputs of the first ten first flip-flops 4013 change from low level to high level, it can be inferred that the rough width of the to-be-measured pulse signal is (10 ps+10×5 ps)=60 ps, and the difference between this width and the actual pulse signal width is relatively large, so the accuracy is insufficient.

At this time, the time delay of the path time delay adjustment circuit 402 may be gradually reduced through the preset adjustment step length of 1 ps, for example. When the time delay of the path time delay adjustment circuit 402 is reduced to 8 ps, the measurement result shows that the outputs of the first ten flip-flops 4013 are still at high-level, so it is estimated that the width of the to-be-measured pulse signal is 68 ps. The time delay of the path time delay adjustment circuit 402 is further reduced. When the time delay of the path time delay adjustment circuit 402 is reduced to 7 ps, the measurement result shows that the output of the $11^{th}$ flip-flop 4013 changes from low level to high level, i.e., the measurement result changes, indicating that the time delay of the path time delay adjustment circuit 402 is over-adjusted. The last measurement result should be taken, i.e., the time delay of the path time delay adjustment circuit 402 immediately before the output of the $11^{th}$ flip-flop 4013 changes from low level to high level, i.e., 8 ps. Therefore, the measurement result shows that the high-accuracy width of the to-be-measured pulse signal is (8 ps+10×5 ps)=58 ps, which improves the accuracy to 1 ps, instead of 5 ps obtained through the time delay of the first buffer 4011, compared with the conventional technology that only uses the first buffer 4011 and the first AND gate 4012 for measurement.

Therefore, the scheme that adds the path time delay adjustment circuit 402 according to the embodiment of the present application improves the measurement accuracy to the preset adjustment step length of the path time delay adjustment circuit 402.

In this way, through the buffer chain 401 with such a structure, according to the schematic diagram of FIG. 6, it can be visually known that the width of the pulse signal includes the delay of the path time delay adjustment circuit 402 and the delay of how many first buffers 4011, so that the width of the pulse signal can be measured with high accuracy.

Of course, such a structure with only the first buffer 4011 and the first AND gate 4012 that directly connected to the clock input terminal of the flip-flop 4013 may cause the flip-flop 4013 to sample data as soon as the first AND gate 4012 outputs a high level, which may lead to the possibility that the pulse width of the high level output by the first AND gate 4012 is too short to meet timing and sequence requirements of the flip-flop 4013, resulting in sampling failure or metastability.

Figure 7:
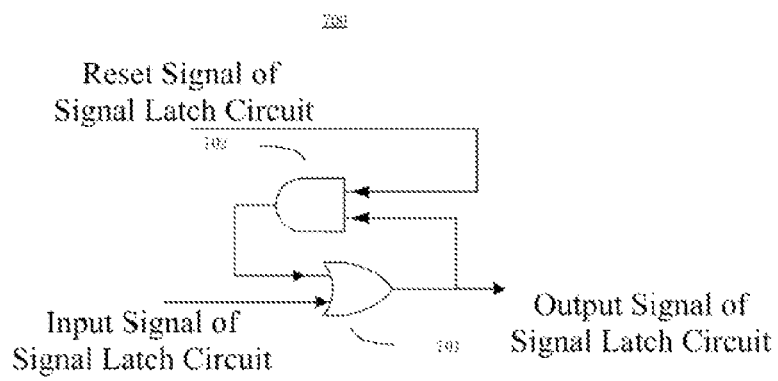
FIG. 7 shows a schematic circuit diagram of a signal latch circuit according to an embodiment of the present application.

Therefore, another embodiment of this application introduces a signal latch circuit (please refer to FIG. 5 and FIG. 7). When the high-level pulse width produced by the first AND gate 4012 used for signal propagation control is short, the signal latch circuit can stably change the output from low level to high level, and provide a stable rising edge sampling signal for the clock terminal of the flip-flop 4013.

FIG. 7 shows a schematic circuit diagram of a signal latch circuit according to an embodiment of the present application.

For the $m^{th}$ first AND gate 4012 (m is a positive integer from 1 to N), a signal latch circuit 700 (as shown in FIG. 7) consisting of one OR gate 701 and one second AND gate 702 is added, and the OR gate 701 and the second AND gate 702 both have two inputs and one output port. One input of the OR gate 701 is the output of the $m^{th}$ first AND gate 4012 used for signal propagation control, the other input of the OR gate 701 is the output of the second AND gate 702 in the signal latch circuit 700, and the output terminal of the OR gate 701 is connected to one input terminal of the second AND gate 702 in the signal latch circuit 700, and is also connected to the clock signal input terminal of the $m^{th}$ first flip-flop 4013 as the output of the signal latch circuit 700. The other input signal of the second AND gate 702 in the signal latch circuit 700 is a reset signal of the signal latch circuit 700, which is controlled by the control device 403 and is at low-level when being reset.

With reference to FIG. 5, the operation mode of the signal latch circuit 700 is as follow: 1) Before the measurement starts, the reset signal of the signal latch circuit 700 is set to be at a low level by the control device 403, and since it is not in the measurement state, the input of the pulse signal width measuring apparatus 500 is always at a low level, so that the output of the first AND gate 4012 used for signal propagation control is at a low level, and therefore, the output of the signal latch circuit 700 is kept at a low level; 2) After the signal latch circuit 700 is reset, the reset signal of the signal latch circuit 700 is set to be at a high level by the control device 403, and at this time the signal latch circuit 700 may be used to capture the high level output by the first AND gate 4012 used for signal propagation control; 3) Once the output of the first AND gate 4012 used for signal propagation control is changed from low level to high level, the output of the OR gate 701 is at high-level, so that the output of the second AND gate 702 is at high-level, or even after the output of the first AND gate 4012 is at low-level, since one input of the OR gate 701 (i.e., the output of the second AND gate 702) is at high-level, the output of the OR gate 701 is still at high-level. That is, if the output of the OR gate 701 is changed from the original low level to the high level, the signal latch circuit 700 will latch the high level value, and one rising edge signal is produced at the clock terminal of the flip-flop 4013 to sample the data of the flip-flop 4013. Of course, the flip-flop 4013 will also be reset before measurement, so that the output is at a low level; during the measurement process, a data terminal D of the flip-flop 4013 is kept at a high level, so once the rising edge signal (output by the OR gate 701) is sampling at the clock terminal connected to the OR gate 701, the output of an output terminal Q of the flip-flop 4013 will change from low level to high level.

Through the signal latch circuit 700, even when the width of the high-level pulse produced by the first AND gate 4012 used for signal propagation control is short, the signal latch circuit 700 can latch this high level and provide one stable rising edge sampling signal for the clock terminal of the flip-flop 4013, so as to meet the timing and sequence requirements of the flip-flop 4013 and avoid the phenomenon of sampling failure or metastability.

Next, a specific circuit embodiment of the path time delay adjustment circuit 402 will be described.

Figure 8A:
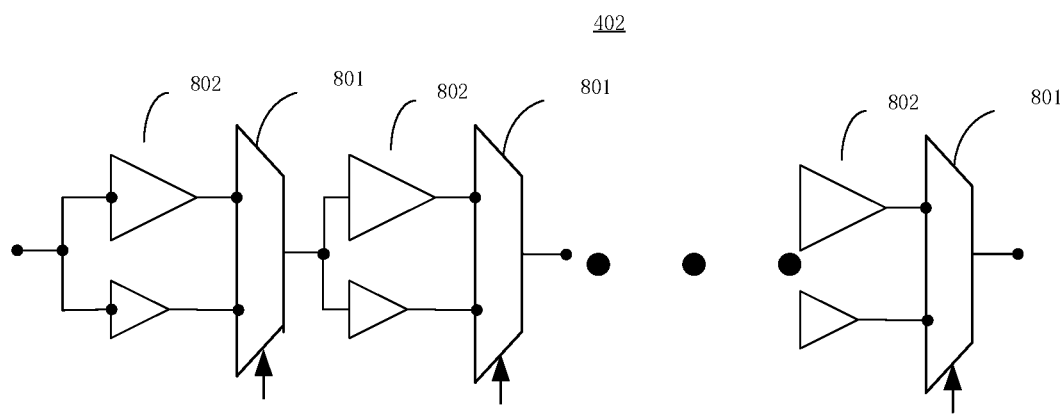
FIG. 8A shows a circuit diagram of an embodiment of a path time delay adjustment circuit according to an embodiment of the present application.

FIG. 8A shows a circuit diagram of one embodiment of the path time delay adjustment circuit 402 according to an embodiment of the present application.

In this embodiment, the path time delay adjustment circuit 402 comprises M first multiplexers (MUX) 801, wherein M is a positive integer. An input terminal of each first multiplexer 801 is connected to at least two second buffers 802 with different buffer time lengths, and the control device 403 inputs a respective path delay adjustment signal to a gating signal terminal of each first multiplexers 801 to gate one of the at least two second buffers 802 to control a time delay produced by the path time delay adjustment circuit 402 to be reduced from the preset time delay by at least one preset adjustment step length. The control device 403 can input the respective path delay adjustment signal to each first multiplexer 801 to adjust the time delay length caused by the second buffers 802 controlled by the respective first multiplexers 801.

For example, there are five first multiplexers 801 in total, and the input terminal of each first multiplexer 801 is connected to two second buffers 802 with different buffer time lengths (e.g., 1 ps, 2 ps, etc.). That is to say, each first multiplexer 801 may cause a delay of 1 ps or 2 ps depending on which second buffer 802 is multiplexed. If the initial delay is 10 ps, the second buffer 802 with a delay of 2 ps is selected for all the five first multiplexers 801. Assuming that the preset adjustment step length is 1 ps, if the time delay produced by the path time delay adjustment circuit 402 is to be controlled to be reduced from the preset time delay by one preset adjustment step length, i.e., 1 ps, it can be controlled that the second buffer 802 with a delay of 1 ps instead of the second buffer 802 with a time delay of 2 ps is selected for a certain first multiplexer 801, so that the total delay of the whole five first multiplexers 801 can be reduced to 9 ps, and so on. If there are another number of first multiplexers 801, another buffer time and other preset adjustment step lengths, adjustment may be made as above.

Figure 8B:
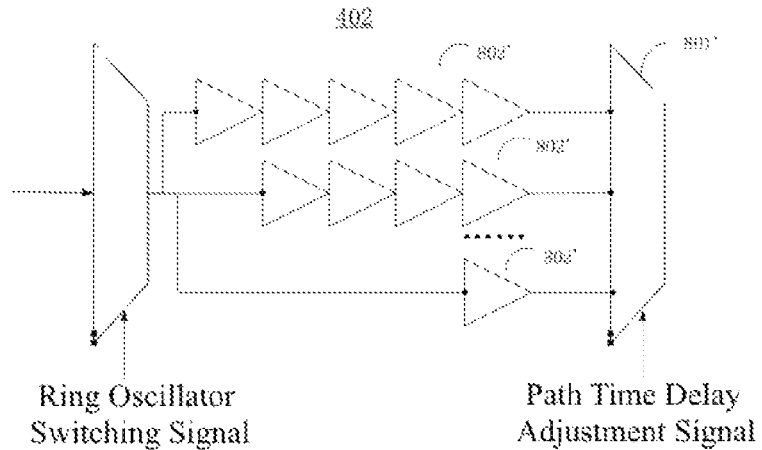
FIG. 8B shows a circuit diagram of another embodiment of a path time delay adjustment circuit according to an embodiment of the present application.

FIG. 8B shows a circuit diagram of another embodiment of the path time delay adjustment circuit 402 according to an embodiment of the present application.

In this embodiment, the path time delay adjustment circuit 402 comprises one first multiplexer 801' which has a plurality of input terminals, and each input terminal is connected to at least two second buffer groups 802' with different total buffer time lengths. Here, different buffer time lengths may be realized by different numbers of second buffers in the second buffer group 802'. And during each adjustment, the control device 403 inputs a path delay adjustment signal to a gating signal terminal of the first multiplexer 801' to gate one of at least two second buffer groups 802', so as to control the time delay produced by the path time delay adjustment circuit 402 to be reduced by at least one preset adjustment step length from the preset time delay. The control device 403 can input the respective path delay adjustment signal to the first multiplexer 801' to respectively adjust the time delay caused by the second buffer through which the first multiplexer 801' passes.

For example, the delay of each buffer is 1 ps, and there are five second buffer groups 802' in total. The first second buffer group 802' includes five buffers, the second second buffer group 802' includes four buffers, and so on. Assuming that the preset adjustment step length is 1 ps, if the time delay produced by the path time delay adjustment circuit 402 is to be controlled to be reduced by one preset adjustment step length (i.e., 1 ps) from the preset time delay 5 ps, then the first multiplexer 801' can be controlled to select the second second buffer group 802' to achieve a delay of 4 ps. Other delays can be achieved in the same manner.

Of course, FIG. 8A and FIG. 8B are only embodiments showing two examples of the path time delay adjustment circuit 402, but this application is not limited to this, and any circuit structure that can adjust the time delay is included in this disclosure.

In the above embodiments, the time delay is adjusted in a more accurate manner through the path time delay adjustment circuit 402, so that the adjustment stops before the time delay is adjusted to a critical point, i.e., if the time delay exceeds the critical point (for example, the time delay of the path time delay adjustment circuit 402 is 7 ps), the output of the latch connected to the first AND gate 4012 of the $P^{th}$ first buffer 4011 is inverted (from low level to high level) and then the adjustment is performed backward (for example, the time delay of the path time delay adjustment circuit 402 is 8 ps), so that the latch connected to the first AND gate 4012 of the $P^{th}$ first buffer 4011 returns to be at the low level, i.e., the best time delay of the path time delay adjustment circuit 402 is fixed to 8 ps. In this way, the measuring device 404 measures the high-accuracy width of the pulse signal through the following steps: the total delay of the first (P−1) first buffers 4011 is added to the delay of the path time delay adjustment circuit 402 before the output of the $P^{th}$ flip-flop 4013 changes, so as to obtain the high-accuracy width of the pulse signal. In this example, assuming P=11, then the high-accuracy width of the pulse signal is (10×5 ps+8 ps)=58 ps.

Of course, the above measurement example is based on the fact that the delay of the first buffer 4011 and the time delay of the second buffer 802 are known. However, it should be noted that due to chip manufacturing process deviation, even if the same buffers are selected to constitute the buffer chain 401 during design, the time delays of the buffers in the same buffer chain 401 may still be different after the chip is manufactured. In addition, factors such as aging and temperature may also affect the time delay of the buffer, and the time delay of the buffer may also change with the passage of time, so there may be an error between the actual time delay of the buffer and the measured value of the time delay, so accumulation cannot be carried out directly according to the known designed values of the time delays. Meanwhile, if the first AND gate 4012 used for signal propagation control is to output a high-level signal, it is required that coincidence duration of the high levels of the two input signals should exceed one minimum threshold duration, which leads to possible errors in the measurement using the above method, wherein the error includes the above minimum threshold duration.

In order to eliminate the error caused by the wiring and the first AND gate 4012 used for signal propagation control, it is possible to measure the clock signal with a known width before the actual measurement, and a difference between the measurement result and the known width of the clock signal is the above error. The pulse width of the to-be-measured signal is: a difference between the actual measurement result and the error, and a random error may be the adjusted step length of the path time delay adjustment circuit 402. This is because the pulse width of the to-be-measured signal is the rough time delays of the N buffers plus the adjusted delay of the path time delay adjustment circuit 402. Assuming that the adjusted step length of the path time delay adjustment circuit 402 is 7 ps, the pulse width of the signal under test is usually between a result of the rough time delay of the N buffers plus 7 ps*j and a result of the rough time delay of the N buffers plus 7 ps*(j+1) (7 ps*j and 7 ps*(j+1) are the delays after two adjacent adjustment of the path time delay adjustment circuit 402). The pulse width of the to-be-measured signal may be close to a result of a rough time delay of the N buffers plus 7 ps*j or a result of a rough time delay of the N buffers plus 7 ps*(j+1), so the error with the least accuracy is 7 ps (i.e., the adjusted step length of the path time delay adjustment circuit 402).

The following scheme of the application can further solve the above problems, achieve the above effects, and further improve the measurement accuracy.

In one embodiment, in order to eliminate the differences between the designed time delay and the actual time delay of the buffers, and to eliminate the influence of the wiring on the time delay, a second multiplexer is introduced into this design.

Referring to FIG. 5, the pulse signal width measuring device 404 further comprises a second multiplexer 501, a plurality of odd NOT gates 502, a counter 503 and a timer 504. FIG. 5 illustratively shows that each group of odd NOT gates 502 includes only one NOT gate (a circle in FIG. 5 indicates a NOT operation). However, in order to realize ring oscillation, each group of odd NOT gates 502 may actually include another number of NOT gates, for example, each group of odd NOT gates 502 may include three NOT gates, which is not limited here. Of course, preferably, the number of NOT gates in each group of NOT gate is the same as each other, so the circuit delay or error caused by these groups of NOT gates is also basically the same.

A plurality of input terminals of the second multiplexer 501 respectively receive the output signals of the output terminals of the N first buffers 4011 and receive the pulse signal and a clock signal with a predetermined pulse width through a plurality of groups of odd NOT gates 502, and the output terminal of the second multiplexer 501 is connected to the path time delay adjustment circuit 402, the output terminal of the path time delay adjustment 402 is also connected to the counter 503, and the counter 503 is further connected with the timer 504.

The measurement process of the pulse signal width measuring apparatus 500 added with the second multiplexer 501, a plurality of odd NOT gates 502, the counter 503 and the timer 504 is as follows:

In order to measure the error caused by the actual time delay of the buffer, threshold time and wiring, a ring oscillator switching signal is output by the control device 403 to the gating signal terminal of the second multiplexer 501 to measure the error with the clock signal with a known pulse width:

First, in the high-accuracy measurement step:

The second multiplexer 501 is controlled to gate the clock signal with a predetermined pulse width, and the time delay produced by the path time delay adjustment circuit 402 is controlled by the measuring device 404 to be reduced by at least one preset adjustment step length from the preset time delay according to the preset adjustment step length during each adjustment through the time delay adjustment of the path time delay adjustment circuit 402 and the control device 403, until the output of the $Q^{th}$ flip-flop 4013 changes, and the delay of the path time delay adjustment circuit 402 is fixed in the state immediately before the output of the $Q^{th}$ flip-flop 4013 changes, wherein Q is a positive integer less than or equal to N.

At this time, the state immediately before the output of the $Q^{th}$ flip-flop 4013 changes is as follows: the output of the first first AND gate 4012 corresponding to the first first buffer 4011 to the output of the $(Q-1)^{th}$ first AND gate 4012 corresponding to the $(Q-1)^{th}$ first buffer 4011 are at high-level, and the output of the other first AND gates 4012 is at low-level.

This step is to fix the most suitable delay of the path time delay adjustment circuit 402, so as to obtain a high-accuracy measurement result of the pulse width. However, the above-mentioned error caused by the actual time delay of the buffer, threshold time and wiring still exist in the measurement result.

Next, in the calibration step:

The second multiplexer 501 is controlled by the control apparatus 403 to gate the output of the $(Q-1)^{th}$ first buffer 4011, and the counter 503 is used to count the ring oscillation within the predetermined time set by the timer 504 to measure the width of the clock signal with the error, and the difference between the predetermined pulse width and the width with the error is taken as the error.

Here, since the second multiplexer 501 gates the output of the $(Q-1)^{th}$ first buffer 4011, the output passes through the odd NOT gates 502, the path time delay adjustment circuit 402, and the first to the $(Q-1)^{th}$ first buffers 4011, through which the ring oscillator is formed, including the odd NOT gates 502, the path time delay adjustment circuit 402, and the first to the $(Q-1)^{th}$ first buffers 4011.

In one example, the pulse signal width measuring apparatus 404 adjusts the path time delay adjustment circuit 402. For example, at this time, the result shows that the time delay of the path time delay adjustment circuit 402 is Bps, and the outputs of the AND gates of the first ten flip-flops 4013 change from low level to high level. If the time delay of the path time delay adjustment circuit 402 is 7 ps, and the output of the AND gate of the eleventh flip-flop 4013 changes from low level to high level, then the control device 403 will adjust the output signal of the tenth flip-flop 4013 selected by the second multiplexer 501. In this way, the pulse signal width measuring device 404 is configured to be the ring oscillator including the odd NOT gates 502, the path time delay adjustment circuit 402, and the first to the tenth first buffers 4011.

Then, the counter 503 being used to count the ring oscillation within the predetermined time set by the timer 504 to measure the width of the clock signal with the error comprises dividing the predetermined time by a count obtained by counting the ring oscillation with the counter 503 within the predetermined time to measure the width of the clock signal with the error.

In one example, when the timer 504 is used to set the predetermined time, for example, 1 μs, in which the count of oscillation reaches 10,000 according to the counter 503, then the width of the clock signal with the error is 0.1 ns, which is obtained by the measurement by the pulse signal width measuring apparatus 500. In this way, by using the counter 503 and the timer 504 to count up how many times the ring oscillator oscillates, the accurate time delay with the error of the to-be-measured pulse signal width can be obtained. However, assuming that the predetermined pulse width of the input clock signal is 1/12 ns, then the difference between the predetermined pulse width of 1/12 ns and the width with the error of 1/10 ns is taken as the error, i.e., 1/10 ns-1/12 ns≈0.0167 ns.

In this way, the pulse signal width measuring apparatus 500 is configured as one ring oscillator for accurate measurement, and the error of the whole pulse signal width measuring apparatus 500 caused by the actual time delay of the buffer, threshold time and wiring can be obtained through the embodiment of the present application, thus the change of the time delay of the buffer chain 401 caused by aging can be effectively avoided and the influence of aging on the measurement accuracy can be reduced.

Next, the actual measurement of the high-accuracy and error-removed width of any pulse signal is introduced.

In the high-accuracy and error-removed measurement mode:

The control device 403 controls the second multiplexer 501 to gate the to-be-measured pulse signal, and after the high-accuracy mode and the calibration step, the measurement apparatus 404 obtains the width of the to-be-measured pulse signal with the error, and subtracts the error from the width of the to-be-measured pulse signal with the error to obtain the high-accuracy and error-removed width of the pulse signal.

Specifically, for the to-be-measured pulse signal, after the high-accuracy mode and the calibration step, the measurement includes the following steps: firstly, in the high-accuracy measurement step:

The second multiplexer 501 is controlled to gate the to-be-measured pulse signal, and the time delay produced by the path time delay adjustment circuit 402 is controlled by the measurement apparatus 404 to be reduced by at least one preset adjustment step length from the preset time delay according to the preset adjustment step length during each adjustment through the time delay adjustment of the path time delay adjustment circuit 402 and the control device 403, until the output of the $Q^{th}$ flip-flop 4013 changes, and the delay of the path time delay adjustment circuit 402 is fixed in the state immediately before the output of the $Q^{th}$ flip-flop 4013 changes, wherein Q is a positive integer less than or equal to N.

Next, in the calibration step:

The second multiplexer 501 is controlled by the control device 403 to gate the output of the $(Q-1)^{th}$ first buffer 4011, and the timer 504 is used to count the ring oscillation with the predetermined time set by the timer 504 to measure the width of the to-be-measured pulse signal with the error.

Next, the subtracting the error from the width of the to-be-measured pulse signal with the error to obtain the high-accuracy and error-removed width of the pulse signal includes:

In the error removing step:

The control device 403 subtracts the error which is previously calculated through the clock signal with a predetermined width from the width of the to-be-measured pulse signal with the error, so as to obtain the high-accuracy and error-removed width of the pulse signal.

It should be noted that, in order to reduce the interference of wiring to the time delay measurement, it is required that a length of the wire from each first buffer 4011 to the second multiplexer 501 is equal to each other when performing wiring.

To sum up, the measurement process of the time-to-digital conversion circuit proposed by various embodiments of this application is as follows:

1) Firstly, calibration is performed. The clock signal with a known pulse width is input into the pulse signal width measuring apparatus, and the path time delay adjustment circuit is adjusted until the output of the flip-flop changes to obtain the high-accuracy value of the clock pulse signal. Then, the pulse signal width measuring apparatus is converted into the ring oscillator by controlling the multiplexer by the control device, and the counter and timer are used to accurately measure the width of the to-be-measured clock pulse signal, which is then compared with the known pulse width value of the clock signal to obtain the measurement error of this structure.

2) The signal of the to-be-measured critical path or the signal of the two to-be-measured time intervals is converted into the to-be-measured pulse signal by using a pulse conversion apparatus, and is input to the pulse signal width measuring apparatus for measurement, and the actual high-accuracy and error-removed measurement result is obtained by removing the error from the measurement result.

Figure 9:
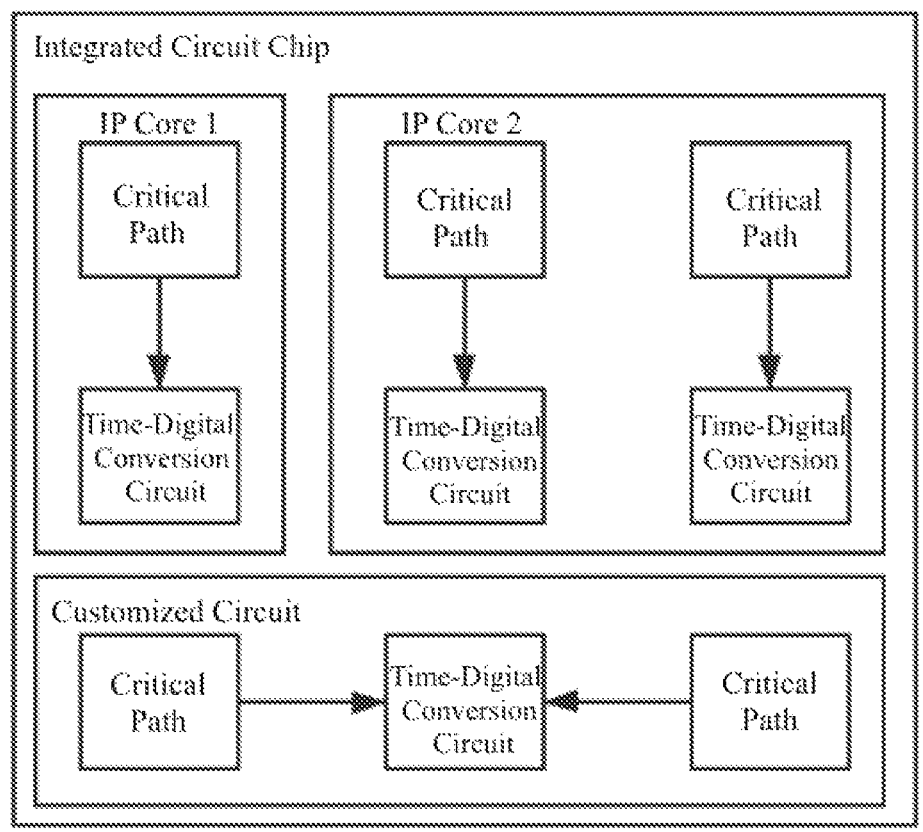
FIG. 9 shows a schematic diagram of placing a time-to-digital conversion circuit designed by this application in each area with a critical path according to an embodiment of this application.

When various embodiments of the present application are used for critical path time delay measurement, since there is more than one critical path in the integrated circuit, one time-to-digital conversion circuit designed in this application may be placed in each area with the critical path, as shown in FIG. 9. FIG. 9 shows a schematic diagram of one time-to-digital conversion circuit designed in this application being placed in each area with the critical path. If there are multiple critical paths in a certain area at the same time, then these critical paths can share one time-to-digital conversion circuit, and what is needed is only to input the outputs of different critical paths into the time-to-digital conversion circuit through one multiplexer.

Each embodiment of the application adopts the path time delay adjustment circuit, which greatly improves the measurement accuracy; the measurement structure is converted into the ring oscillator for more accurate measurement, which reduces the influence of process deviation, aging, wiring and other factors on the accuracy of the measurement structure; the signal latch circuit is used to generate the clock signal of the flip-flop to avoid the metastable phenomenon of the flip-flop; the measurement accuracy is high, and the measurement random error is less than 1 ps under the process of 12 nm; compared with the method of using the digital-to-analog conversion circuit, the resistors and the capacitors, this structure uses a pure digital structure (such as the multiplexer, the logic circuit and the latch structure, etc.), which can be realized by using means in a standard apparatus library, and the pure digital structure can be directly synthesized, which is very friendly to the design process of integrated circuit; this structure is anti-aging, and even if the time delay of the circuit increases due to aging, the measurement accuracy is less affected; this structure only needs a small area overhead, which has little influence on the design of the original integrated circuit.

Figure 10:
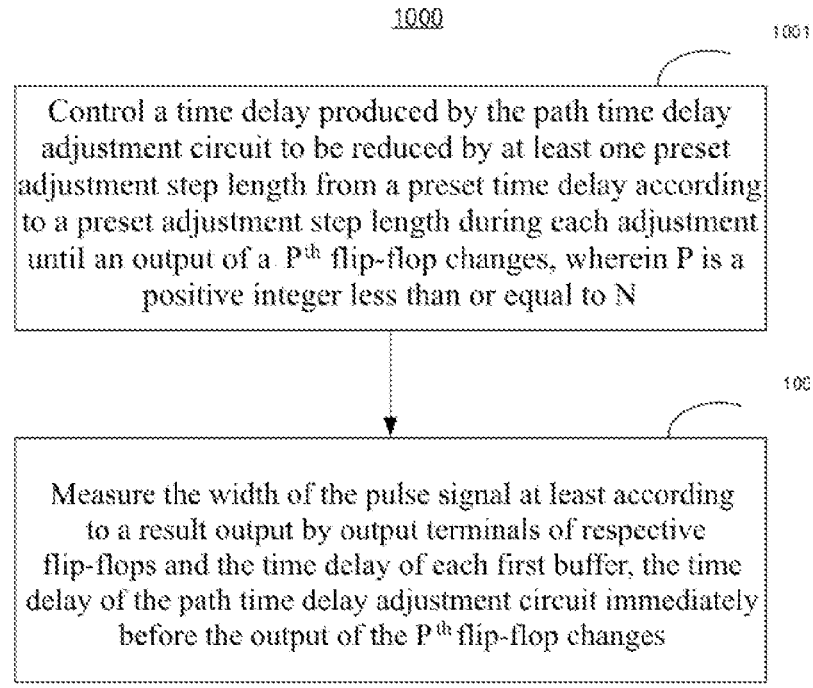
FIG. 10 shows a flowchart of a pulse signal width measuring method of a pulse signal width measuring apparatus according to an embodiment of the present application.

FIG. 10 shows a flowchart of a pulse signal width measuring method of a pulse signal width measuring apparatus according to an embodiment of the present application.

In the pulse signal width measuring method 1000 of the pulse signal width measuring apparatus, the pulse signal width measuring apparatus comprises: a buffer chain, comprising N first buffers, N first AND gates with one input terminal connected to a pulse signal and the other input terminal connected to an output of a corresponding first buffer, and N flip-flops correspondingly coupled to output terminals of respective first AND gates, wherein an output terminal of each of the N first buffers is connected to an input terminal of a next first buffer, wherein N is a positive integer greater than 1; a path time delay adjustment circuit, wherein an input terminal of the path time delay adjustment circuit receives a pulse signal, and an output terminal of the path time delay adjustment circuit is connected to an input terminal of the first buffer in the buffer chain.

The pulse width measuring method comprises the following steps: at step 1001, the time delay produced by the path time delay adjustment circuit is controlled to be reduced by at least one preset adjustment step length from a preset time delay according to a preset adjustment step length during each adjustment until an output of a $P^{th}$ flip-flop changes, wherein P is a positive integer less than or equal to N; and at step 1002: the width of the pulse signal is measured at least according to a result output by output terminals of respective flip-flops, the time delay of each first buffer, and the time delay of the path time delay adjustment circuit immediately before the output of the $P^{th}$ flip-flop changes.

In this way, the scheme of adding the path time delay adjustment circuit and carrying out specific adjustment improves the measurement accuracy to the preset adjustment step length of the path time delay adjustment circuit.

In one embodiment, the path time delay adjustment circuit comprises M first multiplexers, wherein M is a positive integer, an input terminal of each first multiplexer is connected with at least two second buffers with different buffer time lengths, and the step 1001 of controlling the time delay produced by the path time delay adjustment circuit to be reduced by at least one preset adjustment step length from the preset time delay according to the preset adjustment step length during each adjustment comprises the following step: during each adjustment, a respective path delay adjustment signal is input to a gating signal terminal of each first multiplexer to gate one of the at least two second buffers, so as to control the time delay produced by the path time delay adjustment circuit to be reduced by at least one preset adjustment step length from the preset time delay.

In one embodiment, the path time delay adjustment circuit comprises one first multiplexer, the input terminal of which is connected with at least two second buffer groups with different total buffer time lengths. The step 1001 of controlling the time delay produced by the path time delay adjustment circuit to be reduced by at least one preset adjustment step length from the preset time delay according to the preset adjustment step length during each adjustment comprises the following step: during each adjustment, a path delay adjustment signal is input to a gating signal terminal of the first multiplexer to gate one second buffer group of the at least two second buffer groups, so as to control the time delay produced by the path time delay adjustment circuit to be reduced by at least one preset adjustment step from the preset time delay.

In this way, through different embodiments of the path time delay adjustment circuit and different delay adjustment modes, the time delay produced by the path time delay adjustment circuit is controlled to be reduced by at least one preset adjustment step length from the preset time delay.

In one embodiment, the pulse signal width measuring apparatus further comprises a second multiplexer, a plurality of odd NOT gates, a counter and a timer, wherein a plurality of input terminals of the second multiplexer respectively receive the output signals of the output terminals of the N buffers and receive the pulse signal and a clock signal with a predetermined pulse width through a plurality of odd NOT gates, and an output terminal of the second multiplexer is connected with the path time delay adjustment circuit, and the output terminal of the path time delay adjustment circuit is further connected with the counter, and the counter is further connected with the timer.

In one embodiment, the method further includes: inputting a ring oscillator switching signal to the gating signal terminal of the second multiplexer to perform the following steps:

In the high-accuracy measurement step: the second multiplexer is controlled to gate the clock signal with the predetermined pulse width, and the time delay produced by the path time delay adjustment circuit is controlled to be reduced by at least one preset adjusting step length from the preset time delay according to the preset adjustment step length during each adjustment until an output of a $Q^{th}$ flip-flop changes, and the delay of the path time delay adjustment circuit is fixed in a state immediately before the output of the $Q^{th}$ flip-flop changes, wherein Q is a positive integer less than or equal to N.

In the calibration step:
the second multiplexer is controlled to gate the output of a $(Q-1)^{th}$ first buffer, using a timer to count the ring oscillation with a counter within a predetermined time to measure the width of the clock signal with the error, and taking the difference between the predetermined pulse width and the width with the error as an error;

Wherein, the step 1002 of measuring the width of the pulse signal according to at least the output result of each flip-flop and the delay of each first buffer and the delay of the path time delay adjustment circuit immediately before the output of the $P^{th}$ flip-flop changes comprises:

In the measurement mode with high accuracy and error removal:

The second multiplexer is controlled to gate the pulse signal, and the width with the error of the pulse signal to be measured is obtained through the measurement of high-accuracy mode and calibration step, and the error is subtracted from the width with the error of the pulse signal to be measured to obtain the high-accuracy and error-removed width of the pulse signal.

In one embodiment, the step of controlling the second multiplexer to gate the pulse signal, measuring the pulse signal to be measured by the measuring apparatus in a high-accuracy mode and a calibration step to obtain the width with the error of the pulse signal to be measured, and subtracting the error from the width with the error of the pulse signal to obtain the high-accuracy and error-removed width of the pulse signal includes the following steps:

In a high-accuracy measurement step, the second multiplexer is controlled to gate the pulse signal to be measured, the measurement apparatus controls the time delay produced by the path time delay adjustment circuit and the control device to reduce at least one preset adjustment step from the preset time delay according to the preset adjustment step during each adjustment until the output of the $Q^{th}$ flip-flop changes, and the delay of the path time delay adjustment circuit is fixed in the state immediately before the output of the $Q^{th}$ flip-flop changes, where Q is a positive integer less than or equal to N;

In a calibration step: the second multiplexer is controlled by the control device to gate an output of a $(Q-1)^{th}$ first buffer, and the counter is used to count the ring oscillation within a predetermined time set by the timer to measure the width of the to-be-measured pulse signal with an error;

In an error removing step:

the error previously calculated through the clock signal with a predetermined width is subtracted by the control device from the width of the to-be-measured pulse signal with the error, so as to obtain the high-accuracy and error-removed width of the pulse signal.

In this way, the pulse signal width measuring apparatus is configured as a ring oscillator for accurate measurement, and the error of the whole pulse signal width measuring apparatus caused by the actual time delay of the buffer, threshold time and wiring can be obtained through the embodiment of the application, thus the change of the time delay of the buffer chain caused by aging can be effectively avoided and the influence of aging on the measurement accuracy can be reduced.

In one embodiment, the step of using the timer to count the ring oscillation with the counter within the predetermined time to measure the width of the clock signal with the error includes: dividing the predetermined time by a count obtained by counting the ring oscillation with the counter within the predetermined time to measure the width of the clock signal with the error.

In one embodiment, the step 1002 of measuring the width of the pulse signal at least according to the result output by the output terminals of the respective flip-flops, the time delay of each first buffer, and the time delay of the path time delay adjustment circuit immediately before the output of the $P^{th}$ flip-flop changes includes: adding a total time delay of first (P−1) first buffers to the time delay of the path time delay adjustment circuit immediately before the output of the $P^{th}$ flip-flop changes to obtain the high-accuracy width of the pulse signal.

In one embodiment, the pulse signal width measuring apparatus further comprises: N signal latch circuits, wherein each buffer is connected to a clock input of a corresponding flip-flop through a respective signal latch circuit, wherein the input terminal of each flip-flop receives a high level of voltage, wherein each signal latch circuit comprises: a first AND gate, a first input of which is connected to the output terminal of the corresponding buffer, and a second input of which receives the pulse signal; an OR gate, a first input terminal of which is connected with the output terminal of the first AND gate, and the output terminal of which is connected to the clock input terminal of the corresponding flip-flop; and a second AND gate, an output terminal of which is connected to a second input terminal of the OR gate, a first input terminal of which is connected to the output terminal of the OR gate, a second input terminal of which receives a reset signal of the signal latch circuit, and the signal is at a low level when being reset.

In one embodiment, the pulse signal is an output of an XOR gate obtained by taking the signal obtained by the signal at a starting point of a critical path of the integrated circuit passing through the critical path and the signal of the starting point as two inputs of the XOR gate.

To sum up, the measurement process of the time-to-digital conversion circuit proposed by each embodiment of this application is as follows:

Firstly, calibration is performed. The clock signal with known pulse width is input into the pulse signal width measuring apparatus, and the path time delay adjustment circuit is adjusted until the output of the flip-flop changes to obtain the high-accuracy value of the clock pulse signal. Then, the pulse signal width measuring apparatus is converted into the ring oscillator by controlling the multiplexer by the control device, and the counter and timer are used to accurately measure the width of the to-be-measured clock pulse signal, which is then compared with the known pulse width value of the clock signal to obtain the measurement error of this structure.

The signal of the to-be-measured critical path or the signal of the two to-be-measured time intervals is converted into the to-be-measured pulse signal by using a pulse conversion apparatus, and is input to the pulse signal width measuring apparatus for measurement, and the actual high-accuracy and error-removed measurement result is obtained by removing the error from the measurement result.

Each embodiment of the application adopts the path time delay adjustment circuit, which greatly improves the measurement accuracy; the measurement structure is converted into the ring oscillator for more accurate measurement, which reduces the influence of process deviation, aging, wiring and other factors on the accuracy of the measurement structure; the signal latch circuit is used to generate the clock signal of the flip-flop to avoid the metastable phenomenon of the flip-flop; the measurement accuracy is high, and the measurement random error is less than 1 ps under the process of 12 nm; compared with the method of using the digital-to-analog conversion circuit, resistor and capacitor, this structure uses a pure digital structure (such as the multiplexer, logic circuit and latch structure, etc.), which can be realized by using devices in a standard apparatus library, and the pure digital structure can be directly synthesized, which is very friendly to the design process of integrated circuit; this structure is anti-aging, and even if the time delay of the circuit increases due to aging, the measurement accuracy is less affected; this structure only needs a small area overhead, which has little influence on the design of the original integrated circuit.

Figure 11:
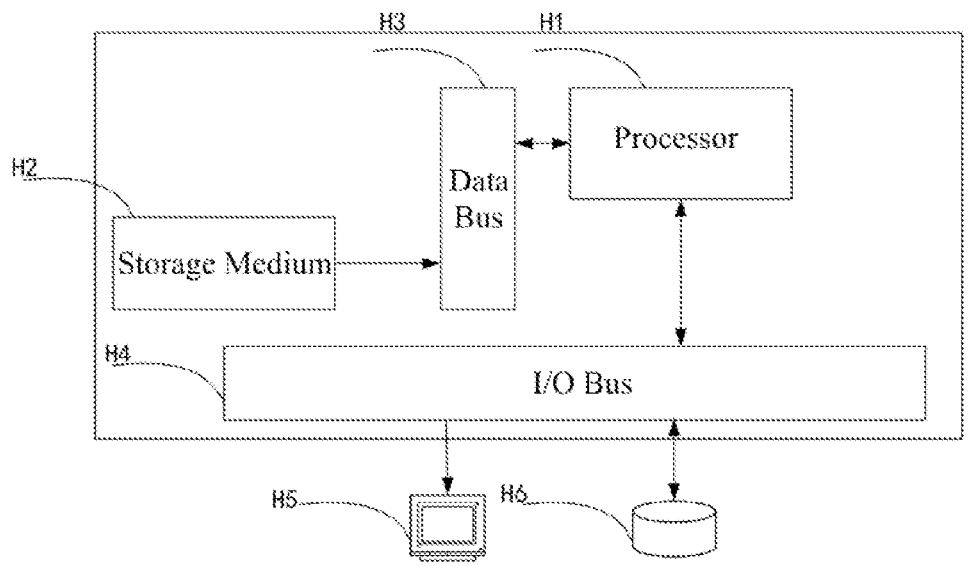
FIG. 11 shows a block diagram of an exemplary computer system suitable for implementing embodiments of the present application.

FIG. 11 shows a block diagram of an exemplary computer system suitable for implementing embodiments of the present application.

The computer system may comprise a processor (H1); a memory (H2) coupled to the processor (H1) and storing therein computer executable instructions for implementing the steps of each method of the embodiments of the present application when executed by the processor.

The processor (H1) may comprise, but is not limited to, one or more processors or microprocessors, for example.

The memory (H2) may comprise, but is not limited to, a Random Access Memory (RAM), a Read Only Memory (ROM), a flash memory, an EPROM memory, an EEPROM memory, a register, a computer storage medium (such as a hard disk, a floppy disk, a solid state disc, a removable disk, a CD-ROM, a DVD-ROM, a Blu-ray disc, etc.).

Besides, the computer system may also comprise a data bus (H3), an input/output (I/O) bus (H4), a display (H5), and an input/output device (H6) (e.g., keyboard, mouse, speaker, etc.) and so on.

The processor (H1) can communicate with external devices (H5, H6, etc.) via a wired or wireless network (not shown) through the I/O bus (H4).

The memory (H2) may also store at least one computer executable instruction for implementing the steps of various functions and/or methods in the embodiments described in this technology when executed by the processor (H1).

In one embodiment, the at least one computer-executable instruction may also be compiled into or constitute a software product, wherein one or more computer-executable instructions, when executed by the processor, implement the steps of various functions and/or methods in the embodiments described in this technology.

Figure 12:
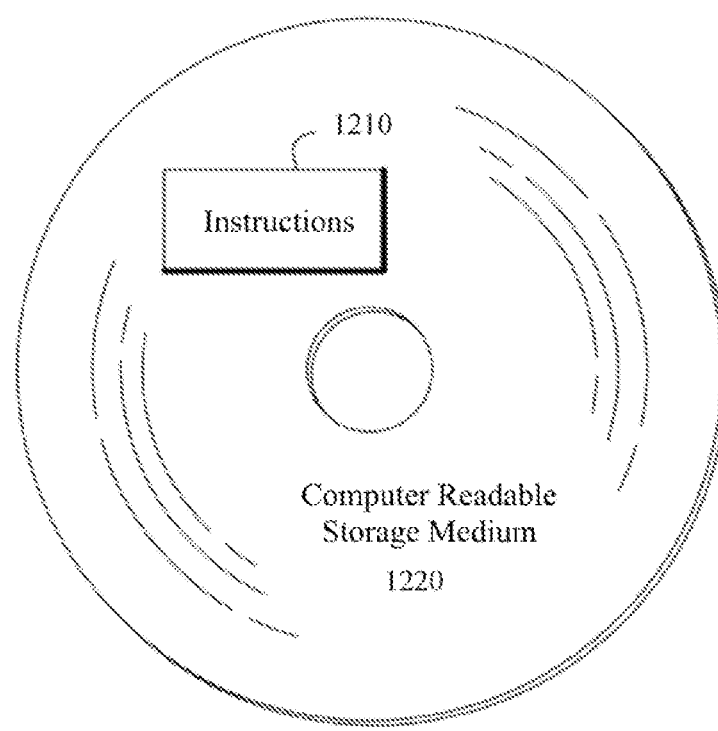
FIG. 12 shows a schematic diagram of a non-transitory computer readable storage medium according to an embodiment of the present disclosure.

FIG. 12 shows a schematic diagram of a non-transitory computer readable storage medium according to an embodiment of the present disclosure.

As shown in FIG. 12, the computer-readable storage medium 1220 stores instructions, such as computer-readable instructions 1210. When the computer readable instructions 1210 are executed by the processor, the power supply voltage detection method described with reference to the above figures may be implemented. The computer readable storage medium include, but is not limited to, a volatile memory and/or a nonvolatile memory, for example. The volatile memory may include, for example, a Random Access Memory (RAM) and/or a cache, etc. The non-volatile memory may include, for example, a Read Only Memory (ROM), a hard disc, a flash memory, etc. For example, the computer-readable storage medium 1220 may be connected to a computing device such as a computer, and then, when the computer-readable instructions 1210 stored in the computer-readable storage medium 1220 are run by the computing device, the above methods can be carried out.

Of course, the above-mentioned specific embodiments are only examples but not limitations, and those skilled in the art may combine some steps and apparatuses from the above separately described embodiments according to the concept of this application to achieve the effect of this application. Such combined embodiments are also included in this application, and will not be described one by one here.

It should be noted that the advantages, merits, effects, etc. mentioned in this disclosure are only examples rather than limitations, and these advantages, merits, effects, etc. cannot be considered as necessary for each embodiment of this application. In addition, the specific details disclosed above are only for the purpose of illustration and easy understanding, but not for limitation, and the above details do not limit the application to adopt the above specific details.

The block diagrams of means, apparatuses, devices and systems involved in this disclosure are only illustrative examples and are not intended to require or imply that they must be connected, arranged and configured in the manner shown in the block diagrams. As those skilled in the art will realize, these means, apparatuses, devices and systems may be connected, arranged and configured in any way. Terms such as "including", "comprising" and "having" are open words, which mean "including but not limited to" and may be used interchangeably with it. The terms "or" and "and" used here refer to the term "and/or" and may be used interchangeably with it unless otherwise stated clearly in the context. The term "such as" used here refers to the phrase "such as but not limited to" and may be used interchangeably with it.

The flow chart of steps in this disclosure and the above method descriptions are only illustrative examples and are not intended to require or imply that the steps of various embodiments must be carried out in the given order. As those skilled in the art will realize, the steps in the above embodiments may be performed in any order. Words such as "after", "then", "next" and so on are not intended to limit the order of the steps; these words are only used to guide readers through the descriptions of these methods. In addition, any reference to a singular element by using the article "a", "an" or "the" is not to be interpreted as limiting the element to the singular.

In addition, the steps and apparatuses in various embodiments herein are not limited to one embodiment. In fact, some related steps and apparatuses in various embodiments herein may be combined according to the concept of this application to conceive new embodiments, and these new embodiments are also included in the scope of this application.

Each operation of the above methods may be performed by any suitable means capable of performing the corresponding functions. The means may include various hardware and/or software components and/or modules, including but not limited to a circuit of hardware, an Application Specific Integrated Circuit (ASIC) or a processor.

The various illustrative logic blocks, modules, and circuits may be implemented or described with a general-purpose processor, a Digital Signal Processor (DSP), an ASIC, a Field Programmable Gate Array Signal (FPGA) or other Programmable Logic Device (PLD), a discrete gate or a transistor logic, a discrete hardware component or any combination thereof designed for performing the functions described herein. The general-purpose processor may be a microprocessor, but alternatively, the processor may be any commercially available processor, controller, microcontroller or state machine. The processor may also be implemented as a combination of computing devices, such as a combination of a DSP and a microprocessor, multiple microprocessors, microprocessors cooperating with a DSP core, or any other such configuration.

The steps of the methods or algorithms described in this disclosure may be directly embedded in the hardware, software module executed by the processor, or in a combination of the two. The software module may be arranged in any form of tangible storage media. Some examples of applicable storage media include a Random Access Memory (RAM), a Read Only Memory (ROM), a flash memory, an EPROM memory, an EEPROM memory, a register, a hard disk, a removable disk, a CD-ROM, etc. The storage medium may be coupled to the processor so that the processor can read information from and write information to the storage medium. In the alternative, the storage medium may be integral with the processor. The software module may be a single instruction or many instructions, and may be distributed on several different code segments, between different programs and across multiple storage media.

The methods disclosed herein include actions for implementing the described methods. The methods and/or actions may be interchanged with each other without departing from the scope of the claims. In other words, unless a specific order of the actions is specified, the order and/or use of specific actions may be modified without departing from the scope of the claims.

The above functions may be implemented by hardware, software, firmware or any combination thereof. If implemented in software, the functions may be stored as instructions on the tangible computer readable medium. The storage medium may be any available tangible medium that can be accessed by a computer. By way of example and not limitation, such a computer readable medium may include a RAM, a ROM, an EEPROM, a CD-ROM or other optical disk storage, magnetic disk storage or other magnetic storage means or any other tangible medium that can be used to carry or store desired program codes in the form of instructions or data structures and can be accessed by a computer. As used herein, disk and disc include a compact disc (CD), a laser disc, an optical disc, a digital versatile disc (DVD), a floppy disk and a Blu-ray disk, wherein disks usually reproduce data magnetically, while discs reproduce data optically using laser.

Therefore, the computer program product can perform the operations given here. For example, such a computer program product may be a computer-readable tangible medium having instructions tangibly stored (and/or encoded) thereon, which may be executed by a processor to perform the operations described herein. The computer program product may include packaging materials.

The software or instructions may also be transmitted through a transmission medium. For example, the software may be transmitted from websites, servers or other remote sources using the transmission medium such as a coaxial cable, a fiber optic cable, a twisted-pair cable, a Digital Subscriber Line (DSL) or a wireless technology such as infrared, radio or microwave.

In addition, the modules and/or other appropriate means for performing the methods and techniques described herein may be downloaded by the user terminal and/or the base station and/or obtained by other means when appropriate. For example, such a device may be coupled to a server to facilitate the conveying of the means for performing the methods described herein. Alternatively, the various methods described herein may be provided via storage components (e.g., a RAM, a ROM, a physical storage medium such as a CD or a floppy disk, etc.), so that the user terminal and/or the base station can obtain various methods when being coupled to the apparatus or providing the storage components to the apparatus. In addition, any other suitable technique for providing the methods and techniques described herein to the apparatus may be utilized.

Other examples and implementations are within the scope and spirit of this disclosure and the appended claims. For example, due to the nature of software, the functions described above may be implemented by a software executed by a processor, hardware, firmware, hard wiring, or any combination of these. Features of the functions may also be physically located at various locations, including being distributed so that parts of functions can be implemented at different physical locations. Furthermore, as used herein and in the claims, "or" used in enumeration of items starting with "at least one" indicates separate enumeration, so that for example, the enumeration of "at least one of A, B or C" means A or B or C, or AB or AC or BC, or ABC (i.e. A and B and C). Furthermore, the word "exemplary" does not mean that the described example is preferred or better than other examples.

Various changes, substitutions and alterations to the techniques described herein may be made without departing from the techniques taught and defined by the appended claims. Furthermore, the scope of the claims of the present disclosure is not limited to specific aspects of the above-described processes, machines, manufacturing, composition of events, means, methods and actions. The the currently existing or later developed processes, machines, manufacturing, compositions of events, means, methods or actions that can perform basically the same functions or achieve basically the same results as the corresponding aspects described herein may be utilized. Therefore, the appended claims include such processes, machines, manufacturing, compositions of events, means, methods or actions within the scope of the claims.

The above description of the disclosed aspects is provided to enable any person skilled in the art to make or use the application. Various modifications to these aspects will be obvious to those skilled in the art, and the general principles defined herein may be applied to other aspects without departing from the scope of this application. Therefore, this application is not intended to be limited to the aspects shown herein, but is to be in accordance with the widest scope consistent with the principles and novel features disclosed herein.

The above description has been given for the purpose of illustration and description. Furthermore, this description is not intended to limit the embodiments of this application to the forms disclosed herein. Although a plurality of example aspects and embodiments have been discussed above, those skilled in the art will recognize some variations, modifications, changes, additions and subcombinations thereof.

What is claimed is:

1. A pulse signal width measuring apparatus, comprising:
a buffer chain, comprising N first buffers, N first AND gates with one input terminal connected to a pulse signal and the other input terminal connected to an output of a corresponding first buffer, and N flip-flops correspondingly coupled to output terminals of respective first AND gates, wherein an output terminal of each of the N first buffers is connected to an input terminal of a next first buffer, wherein N is a positive integer greater than 1;
a path time delay adjustment circuit, wherein an input terminal of the path time delay adjustment circuit receives a pulse signal, and an output terminal of the path time delay adjustment circuit is connected to an input terminal of the first buffer in the buffer chain;
a control device, which controls a time delay produced by the path time delay adjustment circuit to be reduced by at least one preset adjustment step length from a preset time delay according to a preset adjustment step length during each adjustment until an output of a $p^{th}$ flip-flop changes, wherein P is a positive integer less than or equal to N; and a measuring device connected to output terminals of the respective flip-flops and the control device, wherein the measuring device measures the width of the pulse signal at least according to a result output by the output terminals of the respective flip-flops, the time delay of each first buffer, and the time delay of the path time delay adjustment circuit immediately before the output of the $p^{th}$ flip-flop changes.

2. The apparatus according to claim 1, wherein,
the path time delay adjustment circuit comprises M first multiplexers, wherein M is a positive integer, an input terminal of each first multiplexer is connected with at least two second buffers with different buffer time lengths, and during each adjustment, the control apparatus inputs respective path delay adjustment signals to gating signal terminals of the respective first multiplexers to gate one of the at least two second buffers, so as to control the time delay produced by the path time delay adjustment circuit to be reduced by at least one preset adjustment step length from the preset time delay.

3. The apparatus according to claim 1, wherein,
the path time delay adjustment circuit comprises one first multiplexer, the input terminal of which is connected with at least two second buffer groups with different total buffer time lengths, and during each adjustment, the control apparatus inputs a path delay adjustment signal to a gating signal terminal of the first multiplexer to gate one second buffer group of the at least two second buffer groups, so as to control the time delay produced by the path time delay adjustment circuit to be reduced by at least one preset adjustment step from the preset time delay.

4. The apparatus according to claim 1, further comprising a second multiplexer, a plurality of groups of odd NOT gates, a counter and a timer;
wherein a plurality of input terminals of the second multiplexer respectively receive output signals of the output terminals of the N buffers and receive the pulse signal and a clock signal with a predetermined pulse width through the plurality of groups of odd NOT gates; and
an output terminal of the second multiplexer is connected with the path time delay adjustment circuit, and the output terminal of the path time delay adjustment circuit is also connected with the counter, and the counter is further connected with the timer.

5. The apparatus according to claim 4, wherein,
the control apparatus outputs a ring oscillator switching signal to the gating signal terminal of the second multiplexer to:
in a high-accuracy measurement step mode:
control the second multiplexer to gate the clock signal with the predetermined pulse width, wherein the measuring apparatus controls the time delay produced by the path time delay adjustment circuit to be reduced by at least one preset adjustment step length from the preset time delay according to the preset adjustment step length during each adjustment through the time delay adjustment of the path time delay adjustment circuit and the control apparatus, until an output of a $Q^{th}$ flip-flop changes, and fixes the time delay of the path time delay adjustment circuit in a state immediately before the output of the $Q^{th}$ flip-flop changes, wherein Q is a positive integer less than or equal to N;
in a calibration step:
control the second multiplexer to gate an output of a $(Q-1)^{th}$ first buffer, use the counter to count the ring oscillation within a predetermined time set by the timer to measure the width of the clock signal with an error, and take a difference between the predetermined pulse width and the width with the error as the error;
in a high-accuracy and error-removed measurement mode:
control the second multiplexer to gate the pulse signal, and the measuring apparatus obtains the width of the to-be-measured pulse signal with the error through the measurements in the high-accuracy mode and the calibration step, subtracts the error from the width of the to-be-measured pulse signal with the error to obtain a high-accuracy and error-removed width of the pulse signal; and
wherein, the using the counter to count the ring oscillation within the predetermined time set by the timer to measure the width of the clock signal with the error comprises dividing the predetermined time by a count obtained by counting the ring oscillation with the counter within the predetermined time to measure the width of the clock signal with the error.

6. The apparatus according to claim 5, wherein the controlling the second multiplexer to gate the pulse signal, and the measuring apparatus obtaining the width of the to-be-measured pulse signal with the error through the measurements in the high-accuracy mode and the calibration step, and subtracting the error from the width of the to-be-measured pulse signal to obtain the high-accuracy and error-removed width of the pulse signal comprises:
in the high-accuracy measurement step, controlling the second multiplexer to gate the to-be-measured pulse signal, and the measurement apparatus controlling the time delay produced by the path time delay adjustment circuit to be reduced by at least one preset adjustment step length from the preset time delay according to the preset adjustment step length during each adjustment through the time delay adjustment of the path time delay adjustment circuit and the control apparatus, until the output of the $Q^{th}$ flip-flop changes, and fixing the time delay of the path time delay adjustment circuit in the state immediately before the output of the $Q^{th}$ flip-flop changes, wherein Q is a positive integer less than or equal to N;
in the calibration step, the control apparatus controlling the second multiplexer to gate the output of the $(Q-1)^{th}$ first buffer, and using the counter to count the ring oscillation within the predetermined time set by the timer to measure the width of the to-be-measured pulse signal with the error; and
in an error removing step:
the control apparatus subtracting the error previously calculated through the clock signal with a predetermined width from the width of the to-be-measured pulse signal with the error, so as to obtain the high-accuracy and error-removed width of the pulse signal.

7. The apparatus according to claim 1, wherein,
the measuring apparatus measures the high-accuracy width of the pulse signal through the following step:
adding a total time delay of first (P−1) first buffers to the time delay of the path time delay adjustment circuit immediately before the output of the $p^{th}$ flip-flop changes, to obtain the high-accuracy width of the pulse signal.

8. The apparatus according to claim 1, further comprising:
N signal latch circuits, wherein each buffer is connected to a clock input terminal of a corresponding flip-flop through a respective signal latch circuit, wherein the input terminal of each flip-flop receives a high level;
wherein each signal latch circuit comprises:
a first AND gate, a first input terminal of which is connected to the output terminal of the corresponding buffer, a second input terminal of which receives the pulse signal;
an OR gate, a first input terminal of which is connected to the output terminal of the first AND gate, the output terminal of which is connected to the clock input terminal of the corresponding flip-flop; and
a second AND gate, an output terminal of which is connected to a second input terminal of the OR gate, a first input terminal of which is connected to the output terminal of the OR gate, a second input terminal of which receives a reset signal of the signal latch circuit, and the signal is at a low level when being reset.

9. The apparatus according to claim 1, wherein,
the pulse signal is an output of an XOR gate obtained by taking the signal of a starting point of a critical path of the integrated circuit through the critical path and the signal of the starting point as two inputs of the XOR gate.

10. A pulse signal width measuring method of a pulse signal width measuring apparatus, wherein the pulse signal width measuring apparatus comprises:
a buffer chain, comprising N first buffers, N first AND gates with one input terminal connected to a pulse signal and the other input terminal connected to an output of a corresponding first buffer, and N flip-flops correspondingly coupled to output terminals of respective first AND gates, wherein an output terminal of each of the N first buffers is connected to an input terminal of a next first buffer, wherein N is a positive integer greater than 1;
a path time delay adjustment circuit, wherein an input terminal of the path time delay adjustment circuit receives a pulse signal, and an output terminal of the path time delay adjustment circuit is connected to an input terminal of the first buffer in the buffer chain;
wherein the pulse signal width measuring method comprises the following steps:
controlling a time delay produced by the path time delay adjustment circuit to be reduced by at least one preset adjustment step length from a preset time delay according to a preset adjustment step length during each adjustment until an output of a $p^{th}$ flip-flop changes, wherein P is a positive integer less than or equal to N; and
measuring the width of the pulse signal at least according to a result output by the output terminals of the respective flip-flops, the time delay of each first buffer, and the time delay of the path time delay adjustment circuit immediately before the output of the $P^{th}$ flip-flop changes.

11. The method according to claim 10, wherein:
the path time delay adjustment circuit comprises M first multiplexers, wherein M is a positive integer, an input terminal of each first multiplexer is connected with at least two second buffers with different buffer time lengths; and
the step of controlling the time delay produced by the path time delay adjustment circuit to be reduced by at least one preset adjustment step length from the preset time delay according to the preset adjustment step length during each adjustment comprises the following step:
during each adjustment, inputting a respective path delay adjustment signal to a gating signal terminal of each first multiplexer to gate one of the at least two second buffers, so as to control the time delay produced by the path time delay adjustment circuit to be reduced by at least one preset adjustment step length from the preset time delay.

12. The method according to claim 10, wherein,
the path time delay adjustment circuit comprises one first multiplexer, the input terminal of which is connected with at least two second buffer groups with different total buffer time lengths; and
the step of controlling the time delay produced by the path time delay adjustment circuit to be reduced by at least one preset adjustment step length from the preset time delay according to the preset adjustment step length during each adjustment comprises the following step:
during each adjustment, inputting a path delay adjustment signal to the gating signal terminal of the first multiplexer to gate one second buffer group of the at least two second buffer groups, so as to control the time delay produced by the path time delay adjustment circuit to be reduced by at least one preset adjustment step from the preset time delay.

13. The method according to claim 10, wherein the pulse signal width measuring apparatus further comprises a second multiplexer, a plurality of groups of odd NOT gates, a counter and a timer;
wherein a plurality of input terminals of the second multiplexer respectively receive output signals of the output terminals of the N buffers and receive the pulse signal and a clock signal with a predetermined pulse width through the plurality of groups of odd NOT gates; and
an output terminal of the second multiplexer is connected with the path time delay adjustment circuit, and the output terminal of the path time delay adjustment circuit is further connected with the counter, the counter is further connected with the timer.

14. The method according to claim 13, further comprising:
outputting a ring oscillator switching signal to the gating signal terminal of the second multiplexer to perform the following steps:
in a high-accuracy measurement step:
controlling the second multiplexer to gate the clock signal with the predetermined pulse width, and controlling the time delay produced by the path time delay adjustment circuit to be reduced by at least one preset adjustment step length from the preset time delay according to the preset adjustment step length during each adjustment until an output of a $Q^{th}$ flip-flop changes, and fixing the delay of the path time delay adjustment circuit in a state immediately before the output of the $Q^{th}$ flip-flop changes, wherein Q is a positive integer less than or equal to N;
in a calibration step:
controlling the second multiplexer to gate an output of a $(Q-1)^{th}$ first buffer, using the counter to count the ring oscillation within a predetermined time set by the timer to measure the width of the clock signal with an error, and taking a difference between the predetermined pulse width and the width with the error as the error;
wherein the step of measuring the width of the pulse signal at least according to a result output by an output terminal of each flip-flop and the time delay of each first buffer, the time delay of the path time delay adjustment circuit immediately before the output of the $p^{th}$ flip-flop changes comprises:

in a high-accuracy and error-removed measurement mode:
controlling the second multiplexer to gate the pulse signal, obtaining the width of the to-be-measured pulse signal with the error through the measurements in the high-accuracy mode and the calibration step, and subtracting the error from the width of the to-be-measured pulse signal with the error to obtain a high-accuracy and error-removed width of the pulse signal; and
wherein, the step of using the counter to count the ring oscillation within the predetermined time set by the timer to measure the width of the clock signal with the error comprises: dividing the predetermined time by a count obtained by counting the ring oscillation with the counter within the predetermined time to measure the width of the clock signal with the error.

15. The method according to claim 14, wherein the step of controlling the second multiplexer to gate the pulse signal, and the measuring apparatus obtaining the width of the to-be-measured pulse signal with the error through the measurements in the high-accuracy mode and the calibration step, and subtracting the error from the width of the to-be-measured pulse signal to obtain the high-accuracy and error-removed width of the pulse signal comprises:
in the high-accuracy measurement step, controlling the second multiplexer to gate the to-be-measured pulse signal, and the measurement apparatus controlling the time delay produced by the path time delay adjustment circuit to be reduced by at least one preset adjustment step length from the preset time delay according to the preset adjustment step length during each adjustment through the time delay adjustment of the path time delay adjustment circuit and the control apparatus, until the output of the $Q^{th}$ flip-flop changes, and fixing the time delay of the path time delay adjustment circuit in the state immediately before the output of the $Q^{th}$ flip-flop changes, wherein Q is a positive integer less than or equal to N;
in the calibration step, the control apparatus controlling the second multiplexer to gate the output of the $(Q-1)^{th}$ first buffer, and using the counter to count the ring oscillation within the predetermined time set by the timer to measure the width of the to-be-measured pulse signal with the error; and
in an error removing step:
the control apparatus subtracting the error previously calculated through the clock signal with a predetermined width from the width of the to-be-measured pulse signal with the error, so as to obtain the high-accuracy and error-removed width of the pulse signal.

16. The method according to claim 10, wherein,
the step of measuring the width of the pulse signal at least according to a result output by an output terminal of each flip-flop, the time delay of each first buffer, and the time delay of the path time delay adjustment circuit immediately before the output of the $p^{th}$ flip-flop changes comprises:
adding a total time delay of first (P-1) first buffers to the time delay of the path time delay adjustment circuit immediately before the output of the $P^{th}$ flip-flop changes to obtain the high-accuracy width of the pulse signal.

17. The method according to claim 10, wherein the pulse signal width measuring apparatus further comprises:
N signal latch circuits, wherein each buffer is connected to a clock input terminal of a corresponding flip-flop through a respective signal latch circuit, wherein the input terminal of each flip-flop receives a high level;
wherein each signal latch circuit comprises:
a first AND gate, a first input terminal of which is connected to the output terminal of the corresponding buffer, a second input terminal of which receives the pulse signal;
a OR gate, a first input terminal of which is connected to the output terminal of the first AND gate, the output terminal of which is connected to the clock input terminal of the corresponding flip-flop; and
a second AND gate, an output terminal of which is connected to a second input terminal of the OR gate, a first input terminal of which is connected to the output terminal of the OR gate, a second input terminal of which receives a reset signal of the signal latch circuit, which signal is at a low level when being reset.

18. The method according to claim 10, wherein,
the pulse signal is an output of an XOR gate obtained by taking the signal of a starting point of a critical path of the integrated circuit through the critical path and the signal of the starting point as two inputs of the XOR gate.

19. A computer system, comprising:
a processor; and
a non-transitory memory, coupled to the processor and storing therein computer executable instructions for implementing a pulse signal width measuring method of a pulse signal width measuring apparatus when executed by the processor, wherein the pulse signal width measuring apparatus comprises:
a buffer chain, comprising N first buffers, N first AND gates with one input terminal connected to a pulse signal and the other input terminal connected to an output of a corresponding first buffer, and N flip-flops correspondingly coupled to output terminals of respective first AND gates, wherein an output terminal of each of the N first buffers is connected to an input terminal of a next first buffer, wherein N is a positive integer greater than 1;
a path time delay adjustment circuit, wherein an input terminal of the path time delay adjustment circuit receives a pulse signal, and an output terminal of the path time delay adjustment circuit is connected to an input terminal of the first buffer in the buffer chain;
wherein the pulse signal width measuring method comprises the following steps:
controlling a time delay produced by the path time delay adjustment circuit to be reduced by at least one preset adjustment step length from a preset time delay according to a preset adjustment step length during each adjustment until an output of a $p^{th}$ flip-flop changes, wherein P is a positive integer less than or equal to N; and
measuring the width of the pulse signal at least according to a result output by the output terminals of the respective flip-flops, the time delay of each first buffer, and the time delay of the path time delay adjustment circuit immediately before the output of the $p^{th}$ flip-flop changes.

20. The computer system according to claim 19, wherein the pulse signal width measuring apparatus further comprises a second multiplexer, a plurality of groups of odd NOT gates, a counter and a timer;

wherein a plurality of input terminals of the second multiplexer respectively receive output signals of the output terminals of the N buffers and receive the pulse signal and a clock signal with a predetermined pulse width through the plurality of groups of odd NOT gates; and an output terminal of the second multiplexer is connected with the path time delay adjustment circuit, and the output terminal of the path time delay adjustment circuit is further connected with the counter, the counter is further connected with the timer, wherein the pulse signal width measuring apparatus further comprises:

outputting a ring oscillator switching signal to the gating signal terminal of the second multiplexer to perform the following steps:

in a high-accuracy measurement step:

controlling the second multiplexer to gate the clock signal with the predetermined pulse width, and controlling the time delay produced by the path time delay adjustment circuit to be reduced by at least one preset adjustment step length from the preset time delay according to the preset adjustment step length during each adjustment until an output of a $Q^{th}$ flip-flop changes, and fixing the delay of the path time delay adjustment circuit in a state immediately before the output of the $Q^{th}$ flip-flop changes, wherein Q is a positive integer less than or equal to N;

in a calibration step:

controlling the second multiplexer to gate an output of a $(Q-1)^{th}$ first buffer, using the counter to count the ring oscillation within a predetermined time set by the timer to measure the width of the clock signal with an error, and taking a difference between the predetermined pulse width and the width with the error as the error;

wherein the step of measuring the width of the pulse signal at least according to a result output by an output terminal of each flip-flop and the time delay of each first buffer, the time delay of the path time delay adjustment circuit immediately before the output of the $p^{th}$ flip-flop changes comprises:

in a high-accuracy and error-removed measurement mode:

controlling the second multiplexer to gate the pulse signal, obtaining the width of the to-be-measured pulse signal with the error through the measurements in the high-accuracy mode and the calibration step, and subtracting the error from the width of the to-be-measured pulse signal with the error to obtain a high-accuracy and error-removed width of the pulse signal; and wherein, the step of using the counter to count the ring oscillation within the predetermined time set by the timer to measure the width of the clock signal with the error comprises: dividing the predetermined time by a count obtained by counting the ring oscillation with the counter within the predetermined time to measure the width of the clock signal with the error.

* * * * *